United States Patent [19]

Leidich

[11] 4,271,394
[45] Jun. 2, 1981

[54] AMPLIFIER CIRCUIT

[75] Inventor: Arthur J. Leidich, Flemington, N.J.

[73] Assignee: RCA Corporation, New York, N.Y.

[21] Appl. No.: 54,987

[22] Filed: Jul. 5, 1979

[51] Int. Cl.³ .............................................. H03F 3/45
[52] U.S. Cl. ..................................... 330/258; 330/253
[58] Field of Search ............... 330/253, 252, 258, 299

[56] References Cited

U.S. PATENT DOCUMENTS

| | | | |
|---|---|---|---|
| 3,440,554 | 4/1969 | McGraw et al. | 330/258 |
| 3,444,476 | 5/1969 | Leidich | 330/69 |
| 3,614,645 | 10/1971 | Wheatley | 37/191 A |
| 3,644,838 | 2/1972 | Graf | 330/3 |
| 3,757,239 | 9/1973 | Langan | 330/253 |
| 3,922,614 | 11/1975 | van de Plassche | 330/253 |
| 3,953,807 | 4/1976 | Schade | 330/277 |
| 3,959,733 | 5/1976 | Solomon et al. | 330/253 |
| 4,007,427 | 2/1977 | Leidich | 330/258 |

OTHER PUBLICATIONS

Operational Amplifiers by Graeme et al., 1971 McGraw-Hill Book Co. pp. 38-45.
Linear Integrated Circuit D.A.T.A. Book Edition 21 p. 174.
RCA Integrated Circuit DATA Book, 1976 pp. 280, 281.

*Primary Examiner*—Harold A. Dixon
*Attorney, Agent, or Firm*—P. J. Rasmussen; P. M. Emanuel; Clement A. Berard, Jr.

[57] ABSTRACT

An amplifier including two long-tailed-pair configurations in cascade: the first including a pair of bipolar transistors having input signals coupled to their respective bases, their emitters connected to a source of quiescent operating current, and their collectors connected to respective constant current generator loads; and the second including a pair of field-effect transistors having gate electrodes coupled to receive signals from the respective collectors of the first and second bipolar transistors, their source electrodes connected to a source of quiescent operating current, and their drain electrodes connected to subsequent circuit means for deriving an output from at least one of them. By this arrangement substantially the maximum available voltage gain is obtained from the first long-tailed pair. The amplifier may be used as the input circuitry of an operational amplifier, for example, and is suitable for monolithic construction.

19 Claims, 4 Drawing Figures

AMPLIFIER CIRCUIT

BACKGROUND OF THE INVENTION

1. Field of the Invention

This invention relates to an amplifier with a plurality of stages in cascade connection having very high gain, including a first pair of bipolar transistors connected in first long-tailed-pair configuration, a second pair of field-effect transistors connected in second long-tailed-pair configuration in cascade connection after the first long-tailed pair, and constant current generator collector load means for the first long-tailed pair, and more particularly to such an amplifier wherein the gain of the first long-tailed-pair configuration is substantially equal to the maximum available voltage gain.

2. Description of the Prior Art

In a typical prior art plural-stage amplifier, the initial stage of which is a long-tailed-pair connection of transistors, the voltage gain is determined by the transconductances of those transistors and the resistances of the load elements, including the input resistance of the subsequent amplifier stage, which resistances are low relative to the collector resistances of the transistors in the initial long-tail pair. A simplified mathematical expression for this voltage gain is:

$$A = g_m R_L \quad [1]$$

where $g_m$ is the transconductance of the transistor, and $R_L$ is the effective resistance of the load elements paralleled with the input resistance of the following amplifier stage and the collector resistances of the transistors in the long-tailed pair. Because the transconductance $g_m$ is proportional to the emitter current of the transistor, while $R_L$ is substantially independent of that current, the gain A also varies in response to that current. Environmental or parameter variations may also cause changes in A that have a deleterious effect on the amplifier performance. Such variations may be difficult to predict or characterize, thereby making the amplifier much more difficult to apply and, therefore, less desirable. Significant variations in A will adversely affect other characteristics of the amplifier, for example, offset voltage error and common-mode rejection ratio.

The "output offset voltage error" of an amplifier is the deviation of the output DC level from a desired level when both amplifier input terminals are shorted together. Offset voltage error is commonly stated as being referred to the input terminals. This "input offset voltage error" may be defined as that DC input voltage necessary to cause the value of the DC output voltage to equal an arbitrary value, this arbitrary value generally equalling a reference potential commonly midway between the relatively positive and relatively negative operating potentials applied to the amplifier output stage. The input offset voltage error is generally equal to the output offset voltage error divided by the voltage gain of the amplifier.

In operational amplifiers, which typically include a plurality of cascaded amplifier stages, offset voltage error represents an accumulation of imbalances between elements in the input-output signal paths. For example, the difference in the base-emitter operating voltages of bipolar transistors connected in long-tailed-pair configuration provides a signal voltage which contributes to the offset voltage error of that stage. Similar errors introduced in each subsequent stage contribute to the total offset voltage error which comprises the sum of the products of the offset voltage errors of each stage multiplied by the gain of the amplifier between the stage and the output. Output offset voltage error ($V_{os}$) is given by $$V_{os} = (V_{os1} A_1 A_2 A_3 \ldots A_n) + (V_{os2} A_2 A_3 \ldots A_n) + \ldots + (V_{osn} A_n) \quad [2]$$

or $$V_{os} = A_1 V_{os1} + A_2(V_{os1} + V_{os2}) + A_3(V_{os1} + V_{os2} + V_{os3}) + \ldots + A_n(V_{os1} + V_{os2} + \ldots + V_{osn}) \quad [3]$$

where: $V_{osi}$ is the input offset voltage error of the ith stage, and $A_i$ is the voltage gain of the ith stage. In a typical example, all of the $V_{osi}$ may be of similar order of magnitude. Then, if the gain $A_1$ is very large relative to the other gains $A_i$, equation [3] effectively reduces to $$V_{os} = A_1 V_{os1}. \quad [4]$$

Thus, the offset voltage error of the cascade amplifier is dominated by the parameters of a single amplifier stage, preferably, the input amplifier stage.

Offset voltage errors have an undesirable effect on amplifier performance. Offset voltage errors are indistinguishable from the desired error voltages developed by direct-coupled voltage feedback when the amplifier is used to provide direct-coupled amplification. If the amplifier is to function as a comparator, offset voltages introduce errors in the switching characteristics, causing switching to occur at a signal level different from that desired. Clearly, minimizing offset voltage error is desirable to obtain best performance from the amplifier.

Similarly, cascade amplifiers ordinarily should be designed to have a low-noise, high-gain, first stage which substantially determines the noise-figure of the entire amplifier. Analysis of noise performance is analogous to the analysis of equations [2] through [4] hereinabove with mean-square noise voltages $\overline{e_{n1}}^2$ substituted for offset voltages $V_{osi}$. Ordinarily, low-noise bipolar transistors are preferred in a low-noise, high-gain first amplifier stage, components tending to contribute more noise (for example, field-effect transistors and high-ohmic value resistors) are to be avoided, particularly in the first amplifier stage.

In a cascade amplifier having differential inputs, design of the input stage in balanced long-tail-pair configuration with high gain has a material beneficial effect on the common-mode rejection ratio (CMRR) which is the ratio of the gain of the amplifier circuit in response to differential-mode input signals ($A_d$) to its gain in response to common-mode input signals ($A_c$), i.e., $$CMRR = A_d/A_c. \quad [5]$$

As is well known to those skilled in the art, the common-mode signal is the instantaneous algebraic average of two signals applied to a balanced circuit, both signals being referred to a common reference.

Prior art amplifiers have employed constant current source loading of long-tailed-pair transistor amplifiers to generally increase the gain thereof—e.g., as shown in U.S. Pat. No. 3,614,645 issued to C. F. Wheatley. Ordinarily, the base electrodes of bipolar transistors in the following amplifier stage are connected to receive the signal from the collectors of the transistors of the first long-tailed pair. The input resistance of the subsequent amplifier stage is low as compared to the collector resistance of the transistors of the first long-tailed pair, and limits the maximum voltage gain that can be achieved with the first long-tailed pair. Therefore, using cascode-connected transistors to form constant current loads tending to have higher output resistance, will not result in increased voltage gain from the first long-tailed pair.

Application Brief 136, "A Low-Drift, Low-Noise Monolithic Operational Amplifier For Low Level Signal Processing," Fairchild Semiconductor, July, 1969, recommends that the simplest input amplifier configuration possible be used to realize minimum offset voltage error, specifically, two differentially connected transistors having well-matched resistors as the collector loads. Active collector loads should be avoided, according to this reference, because they do not exhibit matching or temperature-tracking characteristics comparable to resistive loads. Such embodiments are severely limited by achievable first stage gain and resistor noise, and therefore have inferior offset voltage and noise performance. The present inventor has discerned that further improvement is achieved by amplifiers, in accordance with his invention, whose first stages have low-noise bipolar transistors and achieve substantially the maximum available voltage gain offered by those transistors.

U.S. Pat. No. 3,644,838 issued to S. Graf, shows an amplifier having bipolar NPN transistors forming a long-tailed-pair first amplifier stage having MOS FET transistor current source active loads, and having P-channel MOS field-effect transistors forming a subsequent amplifier stage. Because the subsequent stage has comparatively low input resistance at the source electrodes of the MOS FET transistors, it prevents the first long-tailed-pair amplifier from realizing or achieving its maximum available voltage gain.

U.S. Pat. No. 3,953,807 issued to O. H. Schade, Jr., illustrates a single-ended, direct-coupled, inverting amplifier output stage having a bipolar transistor with active current source load driving the gate electrode input to a subsequent FET amplifier stage. That configuration, however, is limited to a single-ended output amplifier stage not having an emitter current supply. The present inventor has discerned the need and provided solutions for maintaining substantial equality between the emitter current and the active current-source load current of the bipolar transistor. In the present invention, Schade's technique is extended to a differentially configured amplifier stage and, in particular, to the initial stages of a cascade amplifier to realize improvements in offset voltage error, noise figure, and common-mode rejection ratio not otherwise obtainable.

SUMMARY OF THE INVENTION

The present invention is embodied in an amplifier including two long-tail-pair configurations in cascade: the first including a pair of bipolar transistors having input signals coupled to their respective bases, their emitters connected to a source of quiescent operating current, and their collectors connected to respective constant current generator active loads offering source resistances substantially higher than the collector resistances of the bipolar transistors; and the second including a pair of field-effect transistors having gate electrodes coupled to receive signals from the respective collectors of the first and second bipolar transistors, their source electrodes connected to a source of quiescent operating current, and their drain electrodes connected to subsequent circuit means for providing an output therefrom. These connections cause the first long-tailed-pair configuration to provide the maximum voltage gain available from its bipolar transistors.

DESCRIPTION OF THE PREFERRED EMBODIMENTS

Figure 1:
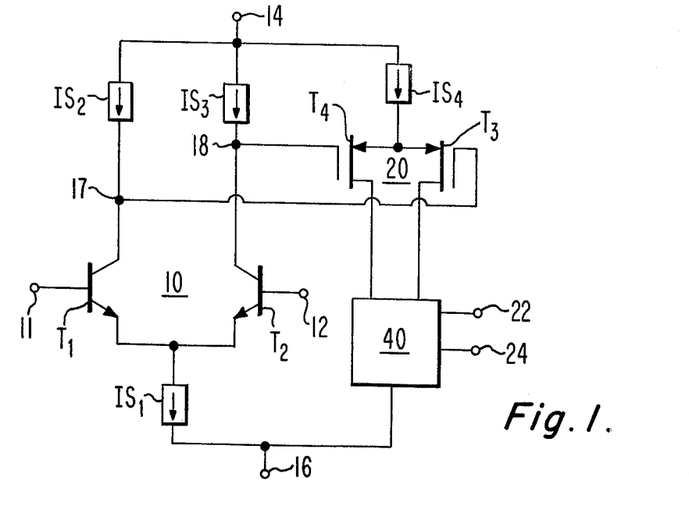
FIG. 1 is a schematic diagram, partially in block form, of an amplifier embodying the invention.

In FIG. 1 supply terminals 14 and 16 are for receiving relatively positive and relatively negative operating voltages, respectively. NPN transistors $T_1$ and $T_2$ are connected in a differential-input, differential-output, long-tail-pair amplifier 10 receiving input signals from terminals 11 and 12 at their bases. Bias current supply $IS_1$ connects first supply terminal 16 to the emitters of $T_1$ and $T_2$ for supplying a tail current that determines the combined quiescent emitter currents of $T_1$ and $T_2$. The collectors of $T_1$ and $T_2$ connect to nodes 17 and 18 between which amplified signals responsive to the input signals received on terminals 11 and 12 are available. Constant current generators $IS_2$ and $IS_3$, having output resistances substantially higher than the collector resistances of $T_1$ and $T_2$, are connected between second supply terminal 14 and nodes 17 and 18, respectively. The quiescent operating current levels of these current source loads substantially equal the quiescent currents flowing in the collector-emitter conduction paths of transistors $T_1$ and $T_2$ and are adjusted to substantially equal the tail current of bias supply $IS_1$.

Field-effect transistors $T_3$ and $T_4$, are connected in a second, differential-input, long-tailed-pair amplifier 20 in cascade after amplifier 10. Nodes 17 and 18 connect to the gates of $T_3$ and $T_4$, respectively, which gates exhibit input resistances much higher than the collector resistances of transistors $T_1$ and $T_2$. Tail current supply $IS_4$ connects second supply terminal 14 to the source electrodes of $T_3$ and $T_4$ for supplying quiescent source currents thereto. Output means 40 connects first supply terminal 16 to the respective drains of $T_3$ and $T_4$ and supplies an amplified output signal between output terminals 22 and 24 responsive to the drain current variations of at least one of the transistors $T_3$ or $T_4$.

The transconductance $g_m$ of a bipolar transistor, e.g. $T_1$ or $T_2$, is proportional to its emitter current. The inverse of transconductance is much less than the collector resistance of the transistor (which collector resistance is used herein as the basis of comparison for resistance levels). Resistances much greater than the collector resistances of $T_1$ and $T_2$ are described as "high" resistances whereas resistances much less than the collector resistances of $T_1$ and $T_2$ are described as "low" resistances.

Constant current generators $IS_2$ and $IS_3$ cooperate with field-effect transistors $T_3$ and $T_4$ to ensure that long-tailed-pair amplifier 10 exhibits substantially the maximum available voltage gain. The gain of amplifier 10 for differential signals, in simplified form, is $$A_1 = g_m R_L = [(q/kT)I_Q]R_L \qquad [6]$$

where:
- $g_m$ = the transconductance of $T_1$ and $T_2$,
- $q$ = electronic charge,
- $k$ = Boltzmann's constant,
- $T$ = absolute temperature (degrees Kelvin),
- $I_Q$ = the value of quiescent current flowing in the collector-emitter conduction path of the transistor, and
- $R_L$ is the effective load resistance at the collectors of transistors $T_1$ and $T_2$.

Load resistance $R_L$ comprises at least three components acting in parallel: the output resistances $R_O$ of current generators $IS_2$ and $IS_3$, the input resistances $R_I$ of amplifier 20, and the collector resistances $R_C$ of transistors $T_1$ and $T_2$. In the present invention, the arrangement of the circuit elements causes the resistances of current sources $IS_2$ and $IS_3$, and the input resistance of amplifier 20, to be very high. Thus, the effective load resistance $R_L$ is substantially determined by the collector resistance $R_C$ of transistors $T_1$ and $T_2$, which is large compared to the resistance $1/g_m$. The gain of amplifier 10 is then $$A_1 = g_m R_C = g_m/h_{oe} \qquad [7]$$

where:
- $h_{oe}$ = the common emitter output admittance of transistors $T_1$ and $T_2$.

The common-emitter output admittance is proportional to the current flowing in the collector-emitter conduction path of the transistor, i.e.

$$h_{oe} = K_d I_Q V_{CB}^{-m} h_{fe} \qquad [8]$$

where:
- $K_d$ = a constant dependent upon the diffusion parameters of the transistor,
- $V_{CB}$ = the collector-base reverse bias voltage applied to the transistor,
- $m$ = a constant exponent of value less than unity (typical values are between ⅓ and ½), and
- $h_{fe}$ = common-emitter forward current gain factor.

Thus, it is evident that the voltage gain of amplifier 10 is $$A_1 = [qV_{CB}^m]/[kTK_d h_{fe}] \qquad [9]$$

which is independent of the quiescent bias current flowing in $T_1$ and $T_2$, and of the resistances associated with the current generators $IS_2$, $IS_3$ and subsequent amplifier 20 coupled thereto.

Although not essential to the analysis above, it is assumed as a matter of convenience that the current gain factor of the transistors is sufficiently large (i.e., $h_{fe} >> 1$) so that the value of current flowing in the collector circuit ($I_{CQ}$) is substantially equal to the value of current flowing in the emitter circuit ($I_{EQ}$) of transistors $T_1$ and $T_2$.

As a result of the substantially maximum vpoltage gain achieved in amplifier 10, the offset voltage error of the complete amplifier is primarily determined by imbalances between transistors $T_1$ and $T_2$. The undesirable and unavoidable differences in transistors $T_3$ and $T_4$ are of much lesser effect on the overall offset voltage error of the amplifier than are any offset voltage errors existing in subsequent circuits. Similarly, that high gain also improves the overall noise figure of the complete amplifier, which noise figure is substantially determined by amplifier 10 and, in particular, $T_1$ and $T_2$.

Figure 2:
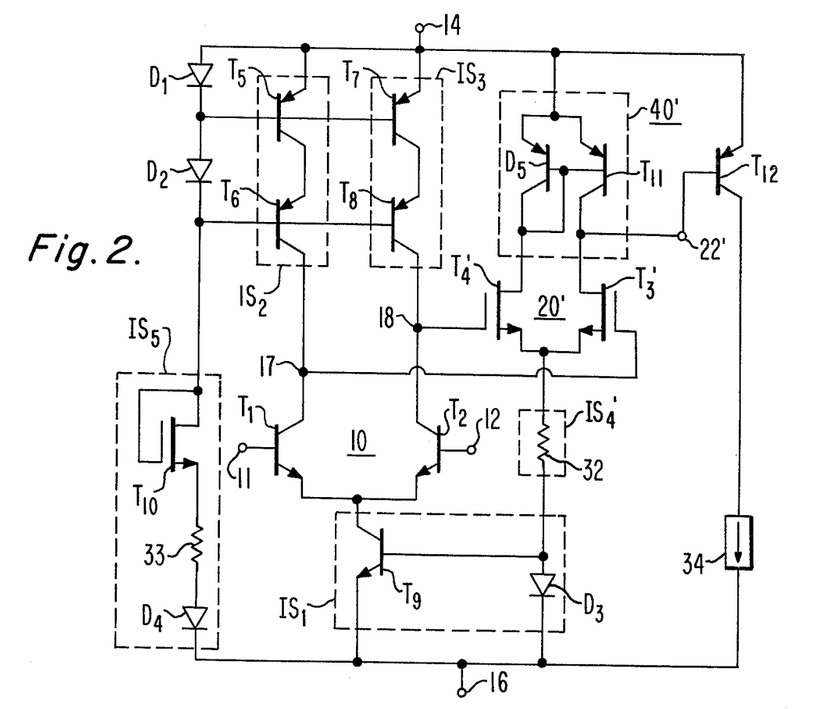
FIG. 2 is a schematic diagram of an amplifier that is an alternative embodiment of the present invention.

FIG. 2 shows an amplifier which differs from that of FIG. 1 in that N-channel field-effect transistors $T_3'$ and $T_4'$ are used in long-tailed-pair configuration 20' connected in cascade following long-tailed-pair configuration 10. N-channel FET's and NPN bipolar transistors are considered to be of a similar conductivity type, complementary to that of P-channel FET's and PNP bipolar transistors insofar as this specification and the claims following it are concerned.

Constant current generator $IS_2$ includes cascode-connected PNP bipolar transistors $T_5$ and $T_6$, and constant current generator $IS_3$ includes cascode-connected PNP bipolar transistors $T_7$ and $T_8$. Current supply $IS_5$ forward biases diodes $D_1$ and $D_2$. The resulting offset potential across $D_1$ biases the bases of $T_5$ and $T_6$ relative to supply terminal 14, and the combined offset potentials across $D_1$ and $D_2$ biases the bases of $T_5$ and $T_6$ relative to supply terminal 14. The configuration comprising $D_1$, $D_2$, $T_5$, $T_6$, $T_7$ and $T_8$ is a dual-output current-mirror amplifier of the basic type described by H. A. Wittlinger in U.S. Pat. No. 3,835,410 issued Sept. 10, 1974 and entitled "CURRENT AMPLIFIER." The collector currents of $T_5$ and $T_7$ are proportional to the current flowing in $D_1$ by simple current-mirror amplifier action. $T_6$ and $T_8$ function as common-base amplifiers having respective output collector current flows which are substantially equal to the currents applied to their respective emitters from the collectors of $T_5$ and $T_7$.

$T_5$ and $T_7$, operated in common-emitter configuration, typically exhibit collector resistances of similar magnitude to those of $T_1$ and $T_2$, which values would reduce the voltage gain achieved by long-tailed pair 10 if not isolated by $T_6$ and $T_8$ respectively. Common-base transistors $T_6$ and $T_8$ exhibit collector resistances much greater than their common-emitter configuration value. In the configuration shown in FIG. 2, the collector output resistances $R_0$ of $T_6$ and $T_8$ are $$R_O = h_{fe}/2h_{oe} \qquad [11]$$

which is greater than the common-emitter collector resistance by a factor of $h_{fe}/2$. Thus, $R_O$ is much larger than the collector resistances of $T_1$ and $T_2$, permitting long-tailed pair 10 to achieve substantially the maximum available voltage gain as set forth in equation [7].

Bias current supply $IS_1'$ includes an NPN transistor $T_9$ with emitter connected to supply terminal 16 and with collector connected to the interconnection between the emitter electrodes of $T_1$ and $T_2$. Tail current supply $IS_1'$ is arranged to demand combined emitter currents from $T_1$ and $T_2$ that condition $T_1$ and $T_2$ to demand respective quiescent collector currents equal to those supplied by $T_6$ and $T_8$. This is arranged by degenerative common-mode feedback controlling the current flowing from the interconnected source electrodes of $T_3'$ and $T_4'$ through source current supply $IS_4'$ (including resistor 32) and diode $D_3$, which diode together with $T_9$ forms a current mirror amplifier. (Diode $D_3$ is conventionally provided by a transistor of the same conductivity type as $T_9$ with emitter, base, and collector connections to the emitter, base and base electrodes respectively of $T_9$). The collector current of $T_9$ is equal to the product of the current flowing through resistor 32 times the current gain of current mirror amplifier $IS_1$.

If the collector current demand of $T_9$ tends to be insufficient to cause the quiescent collector currents of $T_1$ and $T_2$ to equal those supplied by $T_6$ and $T_8$, nodes 17 and 18 will be charged towards supply terminal 14 potential. The increased gate potentials of $T_3'$ and $T_4'$ are coupled by their source-follower action to increase the voltage across resistor 32. By Ohm's Law, this increases current through resistor 32. The current mirror amplifier action of $D_3$, $T_9$ increases the collector current of $T_9$ until the quiescent collector currents demanded by $T_1$ and $T_2$ equal those supplied by $T_6$ and $T_8$.

On the other hand, demand for quiescent collector currents by $T_1$ and $T_2$ which tends to exceed those supplied by $T_6$ and $T_8$ tends to charge nodes 17 and 18 towards terminal 16 potential, tending to reduce the voltage across resistor 32 and current flow therethrough. The current mirror amplifier action of $D_3$, $T_9$ results in $T_9$ tending to demand less collector current, tending to reduce the quiescent collector current demands of $T_1$ and $T_2$.

There is no static error in the degenerative common-mode feedback loop described in the foregoing two paragraphs; an integration is introduced into the loop by $T_3'$ and $T_4'$ responding only to charge and not to current at their gates.

Proper design of current supply $IS_5$ will cause the degenerative common-mode feedback to adjust the quiescent potentials at nodes 17 and 18 at a constant offset from the supply voltage at terminal 14. $IS_5$ may, for example, as shown consist of the series connection of diode-connected N-channel FET $T_{10}$, diode $D_4$, and resistor 33. The resistances of resistors 32 and 33 can be scaled, for example, to maintain nodes 17 and 18 at quiescent potentials equal to the potential at the bases of $T_6$ and $T_8$ to reduce leakage across their collector-base junctions. This allows the long-tailed-pair 10 to accept common-mode potentials at the base electrodes of its transistors $T_1$ and $T_2$ ranging close to the supply voltage on terminal 14.

Diode $D_5$ and transistor $T_{11}$ are connected in current mirror amplifier configuration 40' that converts the balanced variations in the driver currents of $T_3'$ and $T_4'$ to single-ended form at output terminal 22' for application to the base of another PNP transistor $T_{12}$. $T_{12}$ is in common-emitter amplifier connection with emitter connected to terminal 14 allowing amplifier 20' to operate over a wide common-mode voltage range including voltages very close to the voltage on terminal 14. $T_{12}$ has its collector connected to a load circuit 34 and thence to terminal 16. Further improvement is obtained where load circuit 34 is a constant current generator of value such that the base current of $T_{12}$ is nominally equal to that of $T_{11}$ to substantially reduce base current errors in current mirror amplifier 40'.

Figure 3:
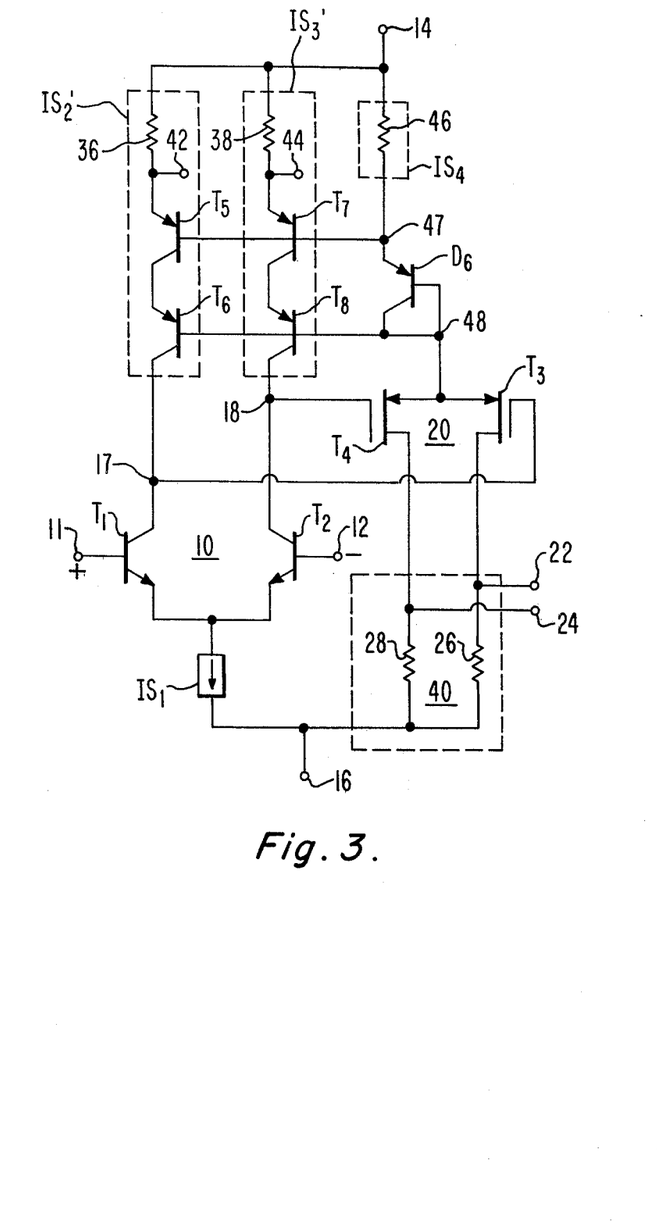
FIG. 3 is a schematic diagram of a species of the FIG. 1 amplifier.

FIG. 3 shows a species of the FIG. 1 cascade amplifier using modifications $IS_2'$ and $IS_3'$ of current sources $IS_2$ and $IS_3$. The potential between supply terminal 14 and first control node 47 is a first control voltage for adjusting the operating levels of $IS_2'$ and $IS_3'$ in common. Constant current generators $IS_2'$ and $IS_3'$ respectively further include resistors 36 and 38 and balance terminals 42 and 44 for providing means to adjust their relative operating current levels with respect to each other for further reducing the offset voltage error of amplifier 10. A reduction, for example, of the potential across resistor 36 causes an increase in the emitter potential of transistor $T_5$ relative to that of transistor $T_7$. Therefore, the current in transistor $T_5$ would tend to increase relative to the current in transistor $T_7$.

External balance adjustment may be accomplished in several ways. For example, resistor(s) may be connected between supply terminal 14 and balance terminal 42 and/or balance terminal 44 modifying the effective resistance in the emitter circuit of transistors $T_5$ and/or $T_7$, respectively, to reduce the voltage drop which would otherwise exist across resistors 36 and/or 38 (ordinarily on the order of a few tenths of a volt).

Quiescent source current supply $IS_4$ supplies current to long-tailed pair 20, as determined by the potential between control node 47 and supply terminal 14 divided by the value of resistor 46, and biases transistors $T_5$ and $T_7$ for conduction. A source of potential offset, diode $D_6$, shown by way of example as a diode connected PNP transistor, provides operating voltage at second control node 48 to bias $T_6$ and $T_8$ for conduction.

FIG. 3 further illustrates a degenerative common-mode feedback connection for maintaining the desired operating current relationship between constant current generators $IS_1$, $IS_2'$ and $IS_3'$, wherein the output currents from $IS_2'$ and $IS_3'$ are adjusted vis-a-vis the output current from $IS_1$. If the operating levels of $IS_2'$ and $IS_3'$ tend to be too low compared to the collector-emitter currents of $T_1$ and $T_2$ respectively, the voltages at nodes 17 and 18 tend to fall towards the potential at supply terminal 16. This voltage change is communicated to first control node 47 by $T_3$ and $T_4$ of long-tailed pair 20 acting as source-follower amplifiers in response to the common-mode voltage change at nodes 17 and 18. In response thereto, the base-emitter voltage of $T_5$ and $T_7$ tends to increase causing a corresponding increase in their respective collector-emitter currents. These increases are communicated to nodes 17 and 18 by common-base transistors $T_6$ and $T_8$, respectively, (whose bias voltage for conduction from node 48 is also proportionately maintained) tending to maintain the desired relationship ($IS_1 = IS_2' + IS_3'$).

For differential-mode voltage signals at nodes 17 and 18, the output resistances of $IS_2'$ and $IS_3'$ and the gate input resistances of $T_3$ and $T_4$ are high as compared to the collector resistances of $T_1$ and $T_2$. For common-mode signals, however, the degenerative feedback connection adjusts the operating currents of $IS_2'$ and $IS_3'$ so as to maintain a relatively fixed common-mode voltage at nodes 17 and 18 thereby causing the "common-mode resistance" to be effectively much lower than the "differential-mode resistance". Therefore, the common-mode gain of long-tailed pair 10 is further reduced while its differential mode gain remains substantially the maximum available voltage gain, further improving the common-mode rejection ratio of the overall amplifier (the common-mode degenerative feedback in the FIG. 2 amplifier causes a similar result).

Output means 40 is shown as simply comprising the drain load resistors 26 and 28 of $T_3$ and $T_4$. The degenerative feedback connection of FIG. 3 makes nearly the entire range of potential between terminals 14 and 16 available to $T_3$ and $T_4$ for source-to-drain potential variation.

Figure 4:
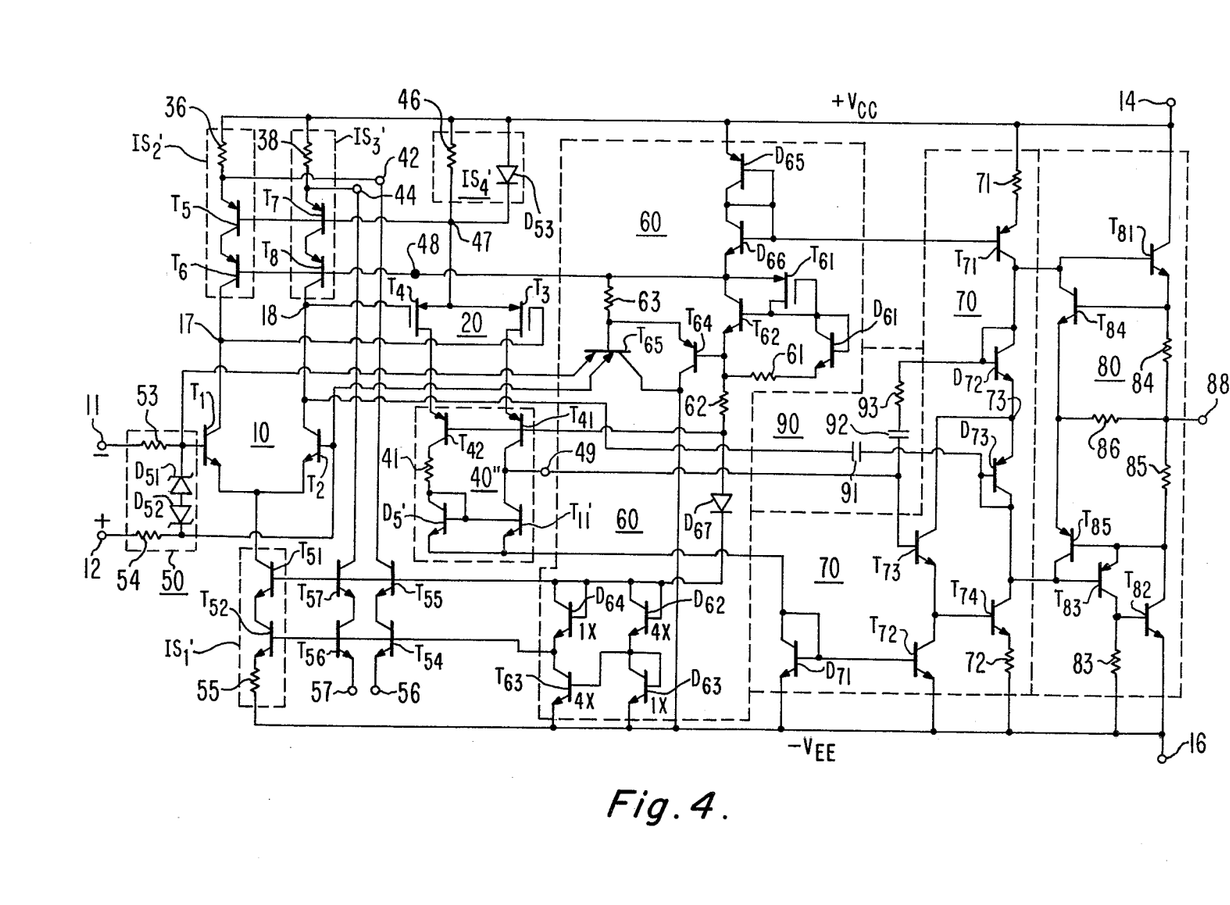
FIG. 4 is a schematic diagram of an operational amplifier employing a species of the FIG. 1 amplifier in its input stages.

In the circuit of FIG. 4, a preferred embodiment of the invention is shown as first and second cascaded stages of an operational amplifier. Long-tailed pairs 10 and 20, constant current generators $IS_2'$, $IS_3'$ and $IS_4'$ operate as described in FIG. 3 preceding.

Current source $IS_1'$ includes resistor 55 and constant current generator transistor $T_{52}$ which, as the slave transistor of a current mirror amplifier having $D_{62}$ through $D_{64}$ and $T_{63}$ forming a master network, establishes the quiescent emitter operating current levels of $T_1$ and $T_2$. Cascade-connected, common-base amplifier transistor $T_{51}$ functions to increase the output resistance of $IS_1'$ thereby further enhancing the common-mode rejection ratio of amplifier 10.

Balancing of constant current generators $IS_2'$ and $IS_3'$ further reduces offset voltage error in long-tailed pair 10 through constant current generator transistors $T_{54}$ and $T_{56}$ whose respective collector currents are controlled by respective resistors (not shown) connected between negative supply terminal 16 and their respective emitter terminals 56 and 57. Those respective collector currents are applied to balance terminals 42 and 44 respectively by cascode-connected, common-base transistors $T_{55}$ and $T_{57}$ which maintain high output resistance to terminals 42 and 44 and minimize the collector voltage variations of $T_{54}$ and $T_{56}$ respectively.

Output differential to single-ended converter 40'' is similar to that described for FIG. 2 hereinabove with the addition of common-base transistors $T_{41}$ and $T_{42}$ and resistor 41 which respectively fix the drain voltages of $T_3$ and $T_4$ and also restrict the voltage excursion possible at terminal 49 to limit output current in conjunction with amplifiers 70 and 80 as described in my patent application Ser. No. 007,500, filed Jan. 29, 1979, entitled "PNP OUTPUT SHORT CIRCUIT PROTECTION," and assigned to the same assignee as the present invention.

Input protection network 50 includes back-to-back avalanche diodes $D_{51}$ and $D_{52}$ to limit the input voltage applied between the respective bases of transistors $T_1$ and $T_2$ while resistors 53 and 54 respectively limit the current in terminals 11 and 12.

Bias potential network 60 generates the necessary currents and voltages to bias elements of $IS_1'$, $IS_2'$, $IS_3'$, amplifier 10, output means 40'', and driver amplifier 70 for conduction. Transistors $T_{61}$ and $T_{62}$ in conjunction with diode $D_{61}$ and resistor 61 establish a constant potential across the collector-emitter electrodes of $T_{62}$ by feedback of the threshold voltage $V_t$ of $T_{61}$ between the collector and base of $T_{62}$. Thus, the voltage at $T_{62}$ emitter is $3 V_D + V_t$ below the voltage at terminal 14, where $V_D$ is the forward bias potential of a diode or a diode-connected transistor.

Diodes $D_{62}$, $D_{63}$, and $D_{64}$ and transistor $T_{63}$ together form a master element of a current mirror amplifier having multiple slave transistors $T_{52}$, $T_{54}$ and $T_{56}$ of the type described in U.S. Pat. No. 3,868,581 entitled "CURRENT AMPLIFIER" issued to A. A. A. Ahmed on Feb. 25, 1975.

Diodes $D_{65}$ and $D_{66}$ together provide bias potentials for cascode transistors $T_6$ and $T_8$ in constant current generators $IS_2'$ and $IS_3'$, and for transistor $T_{71}$ of driver amplifier 70. Diode $D_{67}$ provides a bias potential of $3 V_D$ above the voltage at terminal 16 to the bases of common-base transistors $T_{41}$ and $T_{42}$ of output converter means 40''. Bias current flow in network 60 is determined by Ohm's Law for resistor 62 and the voltage thereacross as determined by the potential applied between supply terminals 14 and 16 less the potential drops across $D_{62}$, $D_{63}$, $D_{65}$, $D_{66}$, $D_{67}$ and $T_{62}$. Resistor 63 and transistor $T_{64}$ cooperate to establish a threshold potential at the base of double-emitter transistor $T_{65}$. The voltages at the bases of $T_1$ and $T_2$ are clamped by forward conduction of the respective emitter-base junctions of $T_{65}$ if either of those voltages exceeds the aforementioned threshold voltage by about 0.6 volts.

Driver amplifier stage 70, in cascade after amplifier 20, further amplifies the signal at terminal 49, and adapts it for driving output amplifier stage 80. Constant current bias is established by transistor $T_{71}$ and resistor 71 responsive to a bias potential from bias network 60. Diode $D_{71}$ and transistors $T_{72}$ and $T_{73}$ establish bias current for driver 70 and provide coupling of signal from output means 40'' through transistors $T_{73}$ and $T_{74}$ and resistor 72 as described in my U.S. Pat. No. 4,064,463 entitled "AMPLIFIER CIRCUIT," and issued on Dec. 20, 1977. Connection of the collector of transistor $T_{73}$ to intermediate node 73 permits $T_{74}$ to saturate allowing the output voltage at terminal 88 to approach supply voltage $-V_{EE}$ more closely for negatively poled output voltage excursions. The potential drops across $D_{72}$ and $D_{73}$ are nominally equal to the base-emitter voltages of $T_{81}$ and $T_{83}$, respectively, (the crossover voltage of output stage 80) to substantially reduce crossover distortion in amplifier 80.

Output amplifier 80 is a quasi-complementary, push-pull, class AB amplifier. It includes NPN output transistor $T_{81}$ for conducting output currents to output terminal 88 from supply terminal 14. Amplifier 80 also includes a compound PNP output transistor (comprising transistors $T_{82}$ and $T_{83}$ and resistor 83) for conducting output currents from output terminal 88 to supply terminal 16. Output current limiting is provided for transistors $T_{81}$ and $T_{82}$ respectively by detection transistors $T_{84}$ and $T_{85}$, current sensing resistors 84 and 85, respectively, and emitter degeneration resistor 86.

Phase compensation network 90 includes capacitors 91 and 92 and resistor 93 for shaping the phase-frequency response to prevent undesired oscillations when the operational amplifier is used in feedback connection.

Embodiments shown in FIGS. 1 through 4, have the most positive potential applied to supply terminal 14 and the most negative potential applied to supply terminal 16. The invention may be made in oppositely poled alternative configurations by interchanging the polarity sense of the supply voltages and changing the transistors to the opposite conductivity type as is known to those skilled in the art.

The advantages of this invention may be more fully appreciated by considering the performance achieved when the invention is constructed in an integrated circuit operational amplifier per FIG. 4. $T_1$ and $T_2$, constructed as vertical NPN transistors, each operate at quiescent collector-emitter currents of approximately one microampere and exhibit collector resistances $R_C$ on the order of 60 megohms. Transistors $T_5$ through $T_8$, constructed as lateral PNP transistors, each operate at quiescent collector-emitter currents of one microampere. They exhibit a current gain factor, $h_{fe}$, of 10 and an output impedance $R_O$ on the order of 330 megohms. Field-effect transistors $T_3$ and $T_4$, constructed as insulated-gate, MOS, P-channel FET's, exhibit an input resistance $R_I$ on the order of $10^{12}$ ohms. The typical voltage gain is two thousand (66 db) in long-tailed pair 10 and one million (120 db) in the overall operational amplifier. As a result of the high gain in amplifier 10, the symmetrical circuit arrangement, the degenerative feedback current control loop, and the close matching of devices available with monolithic construction, typical amplifiers exhibit input offset voltages less than 300 microvolts (on some units, immeasurably small) and common-mode rejection ratios in excess of 100 db.

Further alternative embodiments of the invention, discerned by the inventor but not shown herein, should be apparent to one skilled in the art of design after acquiring an understanding of the techniques disclosed herein. For example, degenerative common-mode feedback techniques controlling the current in $IS_1$, similar to that shown in FIG. 2, can be applied to P-channel amplifier 20 of FIG. 3 or degenerative feedback similar to that shown in FIG. 3 can be applied to N-channel amplifier 20′ of FIG. 2.

What is claimed is:

1. Circuitry in combination with first and second bipolar transistors having matched conduction characteristics being connected in a first long-tailed-pair configuration, and having respective base electrodes for receiving an input signal therebetween, said circuitry for obtaining substantially the maximum voltage gain available from said first long-tailed-pair configuration while introducing substantially no additional source of input offset potential error between the respective base electrodes of said first and second transistors, said circuitry comprising:

first and second supply terminals for receiving an operating voltage therebetween;

first current supply means, included in said first long-tailed-pair configuration, for supplying combined quiescent emitter currents, connected at one of its ends to an interconnection between the emitter electrodes of said first and second transistors and connected at the other of its ends to said first supply terminal;

second current supply means comprising first and second constant current generator means connected at respective first ones of their ends for supplying currents to the collector electrode of said first transistor and to the collector electrode of said second transistor, respectively, and connected at respective second ones of their ends to said second supply terminal, said first and second constant current generator means having respective source resistances which are high compared to the collector resistances of said first and second transistors;

third and fourth, field-effect transistors of like conductivity type to each other having respective gate electrodes to which the collector electrodes of said first and second transistors respectively connect, having respective source and drain electrodes, and exhibiting respective gate input resistances which are high compared to the collector resistances of said first and second transistors;

means for connecting said third and fourth transistors in a second long-tailed-pair configuration including means for supplying their combined source currents connected at one of its ends to an interconnection between the respective source electrodes of said third and fourth transistors and connected at the other of its ends to one of said first and second supply terminals, and including means for connecting the drain electrodes of said third and fourth transistors to the other of said first and second supply terminals; and means for adjusting the relative levels of the output currents of said first and second current supply means including means for generating a feedback signal responsive to the common-mode potentials at the collector electrodes of said first and second transistors, and means for applying said feedback signal to one of said first and second current supply means to complete a degenerative feedback circuit.

2. A combination as set forth in claim 1 wherein said first and second constant current generator means supply currents unaffected by said feedback signal, and wherein said means for applying said feedback signal includes means responsive to said feedback signal for adjusting the current supplied by said first current supply means.

3. A combination as set forth in claim 1 wherein said first current supply means includes third constant current generator means connected between said first supply terminal and the interconnection between the emitter electrodes of said first and second transistors for supplying a current unaffected by said feedback signal, and wherein said meaans for applying said feedback signal includes means responsive to said feedback signal for adjusting the currents supplied by said first and second constant current generator means.

4. A combination as set forth in claim 1 wherein said first current supply means comprises:

third constant current generator means connecting said interconnection between the emitter electrodes of said first and second transistors to said first supply terminal, and having an input terminal for receiving a control current; and means for applying a control current to said input terminal for conditioning said third constant current generator means for supplying said combined quiescent emitter currents.

5. A combination as set forth in claim 4 wherein said means for generating a feedback signal and said means for applying said feedback signal together include, in addition to said third and fourth transistors acting as source followers, means for deriving said control current from the voltage appearing at the interconnection of the source electrodes of said third and fourth transistors.

6. A combination as set forth in claim 5 wherein:

said third constant current generator means includes a current mirror amplifier means having an input terminal connected to receive said control current, an output terminal connected to said interconnection between the emitter electrodes of said first and second transistors, and a common terminal connected to said first supply terminal; and said means for deriving said control current includes resistance means connecting said source electrodes of said third and fourth transistors to said input terminal of said current mirror amplifier means.

7. A combination as set forth in claim 1 wherein said second current supply means comprises:

fifth, sixth, seventh and eighth transistors of conductivity type complementary to that of said first and second transistors, each having a conduction path between respective first and second electrodes responsive to signals applied between its first electrode and a respective third electrode, the first electrodes of said fifth and seventh transistors connecting to said second supply terminal, the second electrode of said fifth transistor connecting to the first electrode of said sixth transistor, the second electrode of said seventh transistor connecting to the first electrode of said eighth transistor, the second electrode of said sixth transistor connecting to the collector electrode of said first transistor, and the second electrode of said eighth transistor connecting to the collector electrode of said second transistor;

means for applying a first control voltage to the third electrodes of said fifth and seventh transistors for conditioning them to supply respective second electrode currents; and means for applying a second control voltage to the third electrodes of said sixth and eighth transistors for conditioning them to conduct the respective second electrode currents of said fifth and seventh transistors.

8. A combination as set forth in claim 7 wherein said means for generating a feedback signal and said means for applying said feedback signal together include, in addition to said third and fourth transistors acting as source followers, means for deriving said first control voltage from the voltage appearing at the interconnection of the source electrodes of said third and fourth transistors.

9. A combination as set forth in claim 8 wherein said means for deriving said first control voltage and said means for applying a second control voltage together include:

resistance means connecting said second supply terminal to the third electrodes of said fifth and seventh transistors;

means for providing an offset potential of said second control voltage with respect to said first control voltage, which means connects the third electrodes of said fifth and seventh transistors to the third electrodes of said sixth and eighth transistors; and a direct-coupled connection connecting the third electrodes of said sixth and eighth transistors to said interconnection of the respective source electrodes of said third and fourth transistors.

10. A combination as set forth in claim 8 wherein:

said means for deriving said first control voltage includes resistance means connecting said second supply terminal to the third electrodes of said fifth and seventh transistors, and a direct-coupled connection connecting the third electrodes of said fifth and seventh transistors to said interconnection of the respective source electrodes of said third and fourth transistors; and said means for applying a second control voltage includes means for generating an offset potential at the third electrodes of said sixth and eighth transistors with respect to said second supply terminal.

11. An amplifier circuit having low offset voltage error comprising:

first and second supply terminals for receiving an operating voltage therebetween;

first and second input signal terminals;

first and second, bipolar transistors of a first conductivity type each having base and emitter and collector electrodes, their respective base electrodes being connected to said first and second input signal terminals respectively;

means for connecting said first and second transistors in a first long-tailed-pair configuration further including first means for supplying tail current connected between said first supply terminal and an interconnection between the emitter electrodes of said first and second transistors;

third and fourth, field-effect transistors of a conductivity type complementary to that of said first and second transistors, each having source and drain and gate electrodes, the gate electrode of said third transistor having the collector electrode of said first transistor connected to it, the gate electrode of said fourth transistor having the collector electrode of said second transistor connected to it, and each of said third and fourth transistors exhibiting high gate electrode input resistance as compared to the collector resistances of said first and second transistors;

fifth and sixth bipolar transistors of opposite conductivity type to that of said first and second transistors, each having base and emitter and collector electrodes, the collector electrode of said fifth transistor being connected to the emitter electrode of said sixth transistor, the collector electrode of said sixth transistor being connected to the collector electrode of said first transistor, first means for connecting, connecting the emitter electrode of said fifth transistor to said second supply terminal;

seventh and eighth bipolar transistors of opposite conductivity type to that of said first and second transistors, each having base and emitter and collector electrodes, the collector electrode of said seventh transistor being connected to the emitter electrode of said eighth transistor, the collector electrode of said eighth transistor being connected to the collector electrode of said second transistor;

second means for connecting, connecting the emitter electrode of said seventh transistor to said second supply terminal;

means for providing at least one output signal responsive to the signals present on the drain electrodes of at least one of said third and fourth transistors;

means for connecting said third and fourth transistors in a second long-tailed-pair configuration, second means for supplying tail current included in said means for connecting said third and fourth transistors in a second long-tailed-pair configuration, said second means for supplying tail current being connected between said second supply terminal and an interconnection between the respective source electrodes of said third and fourth transistors, and including the elements set forth in the following portion of this claim;

means for generating a first control voltage responsive to the common-mode signals present at the gate electrodes of said third and fourth field-effect transistors;

means for applying said first control voltage to the respective base electrodes of said fifth and seventh transistors for completing a degenerative feedback connection for controlling the quiescent collector current of said sixth transistor to equal that of said first transistor and the quiescent collector current of said eighth transistor to equal that of said second transistor; and means for applying a second control voltage to the respective base electrodes of said sixth and eighth transistors.

12. An amplifier circuit according to claim 11 wherein:

said means for generating a first control voltage includes a first resistance means, connected at one of its ends to the respective base electrodes of said fifth and seventh transistors and at the other of its ends to said second supply voltage, for conditioning said fifth and seventh transistors to supply respective collector currents; and said means for applying a second control voltage includes means for providing a potential difference between the respective base electrodes of said sixth and eighth transistors and said second supply terminal for conditioning them to conduct the respective collector currents of said fifth and seventh transistors.

13. An amplifier circuit according to claim 11 wherein said first and second means for connecting, together comprise:

second and third resistance means each respectively connected at one of its ends to the respective emitter electrodes of said fifth and seventh transistors and at the other of its ends to said second supply terminal; and first and second balance terminals connected to the emitter electrodes of said fifth and seventh transistors, respectively, for permitting the value of the quiescent currents flowing in the respective conduction paths of said fifth and seventh transistors to be controlled responsive to signals applied to said first and second balance terminals.

14. An amplifier circuit according to claim 11 wherein said means for providing at least one output signal further comprises current mirror amplifying means having an output terminal connected to said drain electrode of said third transistor, an input terminal connected to said drain electrode of said fourth transistor, and a common terminal connected to said first supply terminal.

15. Differential amplifier circuitry for providing high input resistance relative to the resistance of a signal source comprising:

first and second input terminals for receiving respective input currents;

an amplifier serving as said signal source for supplying said input currents;

first, second, third, fourth, fifth and sixth transistors, each having a conduction path between its respective first and second electrodes responsive to a signal applied between its respective first and third electrodes, the first electrodes of said first and third transistors being connected to a point of operating potential, the second electrode of said first transistor being connected to the first electrode of said second transistor, the second electrode of said second transistor being connected to said first input terminal, the second electrode of said third transistor connected to the first electrode of said fourth transistor, and the second electrode of said fourth transistor connected to said second input terminal;

means connecting said fifth and sixth transistors in long-tailed-pair configuration including an interconnection of their respective first electrodes to each other, a connection of said first input terminal to the third electrode of said fifth transistor, a connection of said second input terminal to the third electrode of said sixth transistor, and means to which the respective second electrodes of said fifth and sixth transistors connect for receiving an output signal responsive to the potential between the respective third electrodes of said fifth and sixth transistors;

a direct-coupled connection from the interconnection of the first electrodes of said fifth and sixth transistors to the respective third electrodes of said first and third transistors;

means for providing a potential between the respective third electrodes of said first and third transistors and the respective third electrodes of said second and fourth transistors, which potential has a value and polarity for biasing said first, second, third and fourth transistors for conduction; and current conductive means connecting the respective third electrodes of said first and third transistors to said point of operating potential.

16. Circuitry according to claim 15 wherein said first, second, third, and fourth transistors respectively further comprise first, second, third and fourth bipolar transistors of a first conductivity type, and said fifth and sixth transistors respectively further comprise fifth and sixth field-effect transistors of that same conductivity type.

17. Circuitry according to claim 15 wherein said means for providing a potential further comprises diode means and said current conductive means comprises resistance means.

18. In an operational amplifier including first and second input signal terminals for receiving an input signal therebetween, an output signal terminal, first and second supply terminals for receiving an operating voltage therebetween, at least first, second, and third amplifier stages each having respective means for receiving at least one input signal and respective means for providing at least one output signal, means for connecting said amplifier stages in cascade connection in order of their ordinal numbering, and means for biasing each said amplifier stage for operation, the improvement wherein said first amplifier stage includes first and second matched bipolar transistors of like conductivity type connected in a first long-tailed-pair configuration having respective base electrodes connected to said first and second input signal terminals, first current supply means supplying combined emitter currents to an interconnection between the respective emitter electrodes of said first and second transistors, and first and second constant current generator means respectively connected to the collecter electrode of said first and second bipolar transistors, each said first and second constant current generator means having respective source resistances which are high as compared to the collector resistances of said first and second transistors;

said second amplifier stage includes third and fourth field-effect transistors of complementary conductivity type to said first and second transistors connected in a second long-tailed-pair configuration, having respective gate electrodes connected to the respective collector electrodes of said first and second transistors, and exhibiting respective input resistances at their gate electrodes which are high as compared to the collector resistances of said first and second transistors, and second current supply means supplying combined source currents to an interconnection between the respective source electrodes of said third and fourth transistors; wherein means are included for adjusting the respective operating levels of said first and second constant current generator means, which means include means for generating a feedback signal responsive to the common-mode components of the voltages at the respective gate electrodes of said third and fourth transistors and include means for applying said feedback signal to complete a degenerative feedback loop for adjusting the operating levels of said first and second constant current generator means to maintain their respective operating levels substantially equal to the respective collector current demands of said first and second transistors; and wherein said third amplifier stage is responsive to the difference in the drain currents of said third and fourth transistors for supplying an amplified response to said output signal terminal.

19. An operational amplifier according to claim 18 wherein said first and second constant current generator means comprise:

fifth, sixth, seventh and eighth transistors of conductivity type complementary to that of said first and second transistors, each having a conduction path between respective first and second electrodes responsive to signals applied between its first electrode and a respective third electrode, the first electrodes of said fifth and seventh transistors connecting to said second supply terminal, the second electrode of said fifth transistor connecting to the first electrode of said sixth transistor, the second electrode of said seventh transistor connecting to the first electrode of said eighth transistor, the second electrode of said sixth transistor connecting to the collector electrode of said first transistor, and the second electrode of said eighth transistor connecting to the collector electrode of said second transistor;

means for applying a first control voltage to the third electrodes of said fifth and seventh transistors for conditioning them to supply respective second electrode currents; and means for applying a second control voltage to the third electrodes of said sixth and eighth transistors for conditioning them to conduct the respective second electrode currents of said fifth and seventh transistors.

* * * * *

UNITED STATES PATENT AND TRADEMARK OFFICE
CERTIFICATE OF CORRECTION

PATENT NO. : 4,271,394
DATED : June 2, 1981
INVENTOR(S) : Arthur J. Leidich

It is certified that error appears in the above—identified patent and that said Letters Patent is hereby corrected as shown below:

Column 2, Line 8 in equation [2] — delete "(" preceeding "$Vos_n A_n$";

Column 2, Line 13 — "ith" should be -- $\underline{i}$th -- ;

Column 2, Line 14 — "ith" should be -- $\underline{i}$th -- ;

Column 5, Line 61 — "vpoltage" should be -- voltage -- ;

Column 8, Line 16 — "potential offset" should be -- offset potential -- ;

Column 9, Line 6 — "Cascade-connected" should be -- Cascode-connected -- ; and

Column 9, Line 58 — after "amplifier 70." and before "Diode $D_{67}$" insert -- The difference between the potential across $D_{65}$, $D_{66}$ and that across

UNITED STATES PATENT AND TRADEMARK OFFICE
CERTIFICATE OF CORRECTION

PATENT NO. : 4,271,394            Page 2 of 2

DATED : June 2, 1981

INVENTOR(S) : Arthur J. Leidich

It is certified that error appears in the above—identified patent and that said Letters Patent is hereby corrected as shown below:

Column 9, Line 58 (Cont.)      -      $D_{53}$ establishes offset potential between nodes 47 and 48. -- .

Column 12, Line 20      -      "meaans" should be -- means -- .

Signed and Sealed this

Fifteenth Day of December 1981

[SEAL]

Attest:

Attesting Officer

GERALD J. MOSSINGHOFF

Commissioner of Patents and Trademarks